(12) United States Patent
Hua

(10) Patent No.: US 6,214,131 B1
(45) Date of Patent: Apr. 10, 2001

(54) MIXED SOLDER PASTES FOR LOW-TEMPERATURE SOLDERING PROCESS

(75) Inventor: Fay Hua, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/182,938

(22) Filed: Oct. 29, 1998

(51) Int. Cl.[7] ................................................. B23K 35/26
(52) U.S. Cl. ................................................ 148/24; 75/252
(58) Field of Search .............................. 148/23, 24, 25, 148/26, 27, 28; 75/252

(56) References Cited

U.S. PATENT DOCUMENTS

| | | | |
|---|---|---|---|
| 5,382,300 | 1/1995 | Blonder et al. ................ | 148/24 |
| 5,443,659 | * 8/1995 | Nonogaki et al. .............. | 148/23 |
| 5,540,379 | * 7/1996 | Kazem-Goudarzi et al. .... | 228/248.5 |
| 5,573,602 | * 11/1996 | Banerji et al. ................. | 148/24 |
| 5,871,690 | * 2/1999 | Achari et al. .................. | 420/559 |

* cited by examiner

Primary Examiner—Daniel Jenkins
(74) Attorney, Agent, or Firm—Marc R. Mayer

(57) ABSTRACT

A mixed solder paste that reflows below 158° C., and, once reflowed, forms a solder alloy with a melting temperature at least 10° C. higher than the reflow temperature of the mixed solder paste, without ternary eutectic structures occurring at approximately 96° C., and with a uniform microstructure. The mixed solder paste according to the invention includes an eutectic or near eutectic tin-lead (Sn—Pb) solder powder, an eutectic or near eutectic lead-bismuth (Pb—Bi) solder powder, and a flux vehicle. The Sn—Pb solder powder and the Pb—Bi solder powder are mixed in a ratio between about 51:49 and about 77:23, but preferably between 55:45 and 65:35. These ratio result in a solder alloy with a mass consisting of 14% and about 25% Bi and between about 35% and about 45% Pb. The invention further provides a method for forming a mixed solder paste for low temperature soldering. The steps of the method include providing a flux vehicle, providing first solder powder, providing a second solder powder, and mixing the flux vehicle, the first solder powder, and the second powder together to form the mixed solder paste. The first solder powder includes a first solder alloy including Sn and Pb. The second solder powder includes a second solder alloy including Pb and Bi. The method may also include mixing the flux vehicle and the tin-lead solder powder to form a first solder paste and mixing the flux vehicle and the lead-bismuth solder powder to form a second solder paste. The first solder paste and the second solder paste may then be mixed together to form the mixed solder paste.

19 Claims, 1 Drawing Sheet

MIXED SOLDER PASTES FOR LOW-TEMPERATURE SOLDERING PROCESS

BACKGROUND OF THE INVENTION

1. Field of the Invention

This invention generally relates to low-temperature solder processes. More particularly, this invention relates to solder pastes used in electronic assembly.

2. Description of the Related Art

Solder paste is widely used in the electronics industry. Solder paste is a combination of a flux carrier and a metallic solder alloy in a powder form. At room temperature the solder paste is compliant enough so that it can be made to conform to virtually any shape. At the same time, it is "tacky" enough that it tends to adhere to any surface it is placed into contact with. These qualities make solder paste useful for both surface mount soldering and for forming solder balls, sometime called solder bumps, on electronic components such as ball grid array (BGA) packages.

During soldering, the flux carrier reacts with and removes oxides from all surfaces involved in the soldering process including the solder pads, solder bumps (discussed in detail, below) and the surfaces of the individual solder spheres that form the solder alloy powder. Once the solder powder begins to melt then molten solder balls coalesce into a whole liquid body. This process is called "reflow". The reflowed solder contacts and wets the solder pads, and, once cooled, solidifies to form a complete solder joint.

Good "wetting" of the solder pad by the reflowed solder is necessary for the formation of a strong bond. Wetting is strongly dependent on the metallurgical reaction between solder and soldering surface, and on the efficiency of the solder paste flux. Wetting starts whenever the molten solder is in contact with clean, oxide-free surface. Therefore, the temperature that solder spheres making up the solder powder starts to melt and the time that the solder is held above the temperature for the flux reaction are important factors for ensuring good wetting and a strong solder joint.

A mixed solder paste for improved wetting is known and described in U.S. Pat. No. 5,382,300 entitled, "Solder Paste Mixture". This mixed solder paste includes mixing eutectic tin-lead solder with various other metals and alloys in order to improve the wetting and strength of the solder joints.

In general, the surface mount soldering process involves placing the electrical contact of an electronic component or substrate, a small amount of solder paste, and a solder-wettable pad on a printed circuit board (PCB) in close proximity. They are then heated until the solder reflows, forming an electrical connection between the solder-wettable pad and the electrical contact of the electronic component. Once the solder has cooled, it forms both an electrical and a mechanical connection between the electronic component and the PCB. This process has numerous advantages over other methods of interconnection. First, a large number of components can be interconnected simultaneously. Second, the process is highly repeatable and relatively low cost and is easily adapted for mass production.

The surface mount soldering process typically begins by stencil printing solder paste onto the solder-wettable pads of a PCB. Once the solder paste is on the solder-wettable pads, the electronic components to be soldered are aligned and set into place on the PCB with the electrical contacts of the electronic components in contact with the solder paste. The solder paste holds the electronic components in place during the heating and reflow process.

Solder bumps may be formed on the solder-wettable pads of an electronic component or a PCB using a method termed contained paste deposition (CPD) described in U.S. Pat. No. 5,539,153 assigned to the assignee of this invention. CPD provides for effective "micro-stenciling" of substances. Using a CPD process, a mask is used to micro stencil solder paste onto the solder-wettable pads. The solder paste is then reflowed and forms into solder spheres, each wetted to a solder-wettable pad. The solder sphere is cooled, forming the solder bump. The mask may then be removed.

While many types of solder paste can be used to perform surface mount soldering and to form solder bumps, the conventional solder paste used contains an eutectic tin-lead solder alloy powder containing 63 percent (%) tin, by weight, and 37% lead, by weight, (63Sn—37Pb). 63Sn—37Pb solder alloy has a melting temperature of 183 degrees Celsius (° C.). Typically, the soldering reflow process temperature peaks 20° C. to 30° C. above the melting temperature of the solder alloy (peak reflow temperature). This ensures the solder on the whole PCB melts completely, flows properly, and wets solder-wettable surfaces adequately, thus assuring quality solder joints. For the 63Sn—37Pb solder alloy, the peak reflow temperature typically is approximately 210° C.–220° C. Such high temperatures can induce considerable strain in a multilayer PCB that the electronic components are usually soldered to. High temperatures can also damage temperature-sensitive electronic components as they are being soldered. Consequently, more expensive components or extra assembly processes are often required in order to avoid damaging the PCB and the electronic components.

In addition, the melting temperature of the 63Sn—37Pb solder alloy may make its use undesirable in some step soldering processes. Step soldering processes are processes in which, in a subsequent operation, electronic components are soldered to a PCB that already has some electronic components soldered to it. Step soldering processes might be used, for example, to solder components on a second side of a PCB that already has components soldered to the first side. For purposes of this description, the electronic components soldered to the PCB prior to the subsequent operation will be called "original components" and the solder alloy holding the original components to the PCB will be called "first solder."

In step soldering processes, the integrity of the solder connections between the original components and the PCB may be compromised if the first solder melts during the subsequent soldering operation. The likelihood that melting the first solder will compromise the integrity of the solder connections is increased both the original components are relatively heavy, and when components are soldered to both sides of the PCB. This increase in the likelihood of compromised solder connections is because the tackiness of solder paste and the surface tension of molten solder is often enough to hold relatively light components in place during a soldering reflow operation, even when the relatively light components are inverted. The tackiness of the solder paste and the surface tension of the molten solder, however, may be overcome by gravity with relatively heavy inverted components. An example of a relatively heavy electronic component is a ball-grid-array package. If both the first solder and the solder used in the subsequent soldering operation are 63Sn—37Pb solder alloy, the first solder will almost always melt during the subsequent soldering operation.

To avoid melting the first solder, the reflow temperature of the solder paste used in the subsequent soldering operation should be at least 25° C. lower than the melting temperature of the first solder. The 25° C. difference between the melting temperature of the first solder and the reflow temperature of the solder paste in the subsequent soldering operation allows two conditions to be met. First, the subsequent soldering operation can occur at 20° C. above the melting point of the solder alloy used in the subsequent soldering operation to ensure quality solder joints. Second, the subsequent soldering operation can occur at a safe 5° C. below the melting point of the first solder. If the first solder is the common 63Sn—37Pb solder alloy with a melting temperature of 183° C., then the solder paste used in the subsequent soldering operation should have a reflow temperature below 158° C.

Some low-temperature reflow solder pastes containing low-temperature melting solder alloys are known in the art. For example, eutectic bismuth-tin (58Bi—42Sn) solder alloy melts at 138° C., a temperature suitable for low-temperature soldering processes including step soldering. 58Bi—42Sn solder alloy does not work well, however, with electronic component leads or with PCBs having tin-lead (Sn—Pb) alloy cladding. Such electronic component leads and PCBs are commonly used in the electronics industry.

When molten 58Bi—42Sn solder alloy wets the Sn—Pb alloy cladding, the lead (Pb) atoms in the cladding diffuse into the molten 58Bi—42Sn solder. The Pb atoms induce a new bismuth-lead-tin ternary eutectic structure (52Bi—30Pb—18Sn) in the solder alloy that melts at approximately 96° C. (~96° C. structure). In general, a ternary eutectic structure is a combination of the elements the form the alloy in a ratio that melts at a temperature below the other possible combinations of the elements. In some cases, the formation of ternary eutectic structures can cause portions of the solder alloy that begins to melt before the overall solder alloy melts resulting in a "plastic" phase that is neither completely solid nor completely melted. Ternary eutectic structures can be detected using differential scanning calorimetry. In bismuth-lead-tin (Bi—Pb—Sn) solder alloys, it has been found that the ~96° C. structures accelerate grain growth as the solder goes through temperature cycles that include temperatures higher than the melting temperature of the ~96° C. structures. The accelerated grain growth within the Bi—Sn—Pb solder contributes to premature fatigue failure of the solder connection.

Other Bi—Sn—Pb solder alloys are known that are not susceptible to the formation of ~96° C. structures when used with Sn—Pb clad component leads or PCBs. For example, 43Sn—43Pb—14Bi solder alloy, with a melting point of 172° C., is known. The melting point of the 43Sn—43Pb—14Bi solder alloy is not low enough, however, to be used as a subsequent solder if the original solder is the common 63Sn—37Pb solder alloy.

Solder alloys that include indium (In), such as 40In—40Sn—20Pb and 52In—48Sn, are also known in the art. The indium solder alloys are not subject to the formation of ~96° C. structures like the Bi—Sn—Pb solder alloys, are compatible with Sn—Pb clad components leads or PCBs, and have a melting point below 158° C. Indium, however, is relatively rare and expensive when compared to tin, lead, and bismuth. The use of solder alloys containing indium can therefore be prohibitively expensive.

Extremely low-temperature melting solders are also known in the art for soldering superconducting devices. These solders include the near-eutectic 56.2Bi—27Pb—16Sn and 52.5Bi—32Pb—15.5Sn alloys that both melt at approximately 100° C. These solders include the ~96° C. structures and are often not strong enough for many of the conventional electronic components that operate between 25° C. and 75° C.

In addition, when the low-temperature melting solder alloys discussed above are used in a solder paste, any solder joints, solder interconnects, solder bumps, or other solder structures formed by reflowing the solder paste will have a melting temperature at or near the reflow temperature of the solder paste. This raises several concerns. First, if any additional step-soldering processing takes place, the low-temperature melting solder structures are likely to reflow during the step-soldering process unless an even lower-melting solder alloy is used. As discussed above, reflowing previously created solder structures during subsequent step-soldering may compromise the integrity of the connections between the original electronic components and the PCB.

The second concern is that the low-temperature melting solder structures may weaken when exposed to temperatures approaching the reflow temperature of the solder paste used to form them.

Accordingly, it is apparent that there is a need for a low-cost solder paste that reflows below 158° C. and that reflows to form a Bi—Sn—Pb solder alloy that does not include ~96° C. structures, is not susceptible to ~96° C. structure formation when used with Sn—Pb clad electronic component leads or PCBs, and has a melting temperature at least 10° C. above the reflow temperature of the solder paste.

SUMMARY OF THE INVENTION

Generally the invention provides a low-cost, solder paste that reflows below 158° C., and, once reflowed, forms a bismuth-lead-tin (Bi—Pb—Sn) solder alloy with a melting temperature at least 10° C. higher than the reflow temperature of the solder paste, without ternary eutectic structures occurring at approximately 96° C., and with a uniform microstructure. Specifically, the invention provides a mixed solder paste including an eutectic or near eutectic tin-lead (Sn—Pb) solder powder, an eutectic or near eutectic lead-bismuth (Pb—Bi) solder powder, and a flux vehicle. The reflow temperature of the mixed solder paste is below 158° C. while the melting temperature of the solder alloy formed by reflowing the solder paste is at least 10° C. above the reflow temperature of the mixed solder paste.

The invention provides that the ratio of the mass of tin (Sn) to the mass of lead (Pb) in the Sn—Pb solder power may be between 58:42 and 68:32, but is preferably 63:37. Similarly, the invention provides that the ratio of the mass of Pb to the mass of bismuth (Bi) in the Pb—Bi solder powder may be between 39:61 and 49:51 but is preferably 44:56.

The invention also provides that the ratio of the mass of the Sn—Pb solder powder to the mass of the Pb—Bi solder powder within the mixed solder paste may be between about 51:49 and about 77:23, but it is preferably between 55:45 and 65:35. In addition, the sum of the mass of the Sn—Pb solder powder and the mass of the Pb—Bi solder powder should consist of between about 14% and about 25% Bi and between about 35% and about 45% Pb.

The invention provides that the solder alloy resulting from reflowing the mixed solder paste preferably has a uniform micro-structure and lacks ternary eutectic structures occurring at approximately 96° C.

The invention further provides a method for forming a mixed solder paste for low temperature soldering. The steps of the method include providing a flux vehicle, providing first solder powder, providing a second solder powder, and mixing the flux vehicle, the first solder powder, and the second powder together to form the mixed solder paste. The first solder powder includes a first solder alloy including Sn and Pb. Similarly, the second solder powder includes a second solder alloy including Pb and Bi. The mixed solder paste made using this method has a peak reflow temperature at least 10° C. below a melting temperature of a solder alloy formed when the mixed solder paste is reflowed.

The method according to the invention may also include mixing the flux vehicle and the tin-lead solder powder to form a first solder paste and mixing the flux vehicle and the lead-bismuth solder powder to form a second solder paste. The first solder paste and the second solder paste may then be mixed together to form the mixed solder paste.

The method according to the invention may also include mixing the first solder powder and the second solder powder in a ratio, by mass, of between 45:55 and 75–25, but preferably between 55:45 and 65:35.

The method according to the invention may further include mixing the first solder powder and the second solder powder together in a ratio in which bismuth accounts for between about 14% and about 25% of a metallic mass of the mixed solder paste. Finally, the method according to the invention may include mixing the first solder powder and the second solder powder together in a ratio in which lead accounts for between about 33% and about 46% of a metallic mass of the mixed solder paste.

Other features and advantages of the present invention will become apparent from the following detailed description, taken in conjunction with the accompanying drawing, illustrating, by way of example, the principles of the invention.

DESCRIPTION OF THE PREFERRED EMBODIMENT

Figure 1:
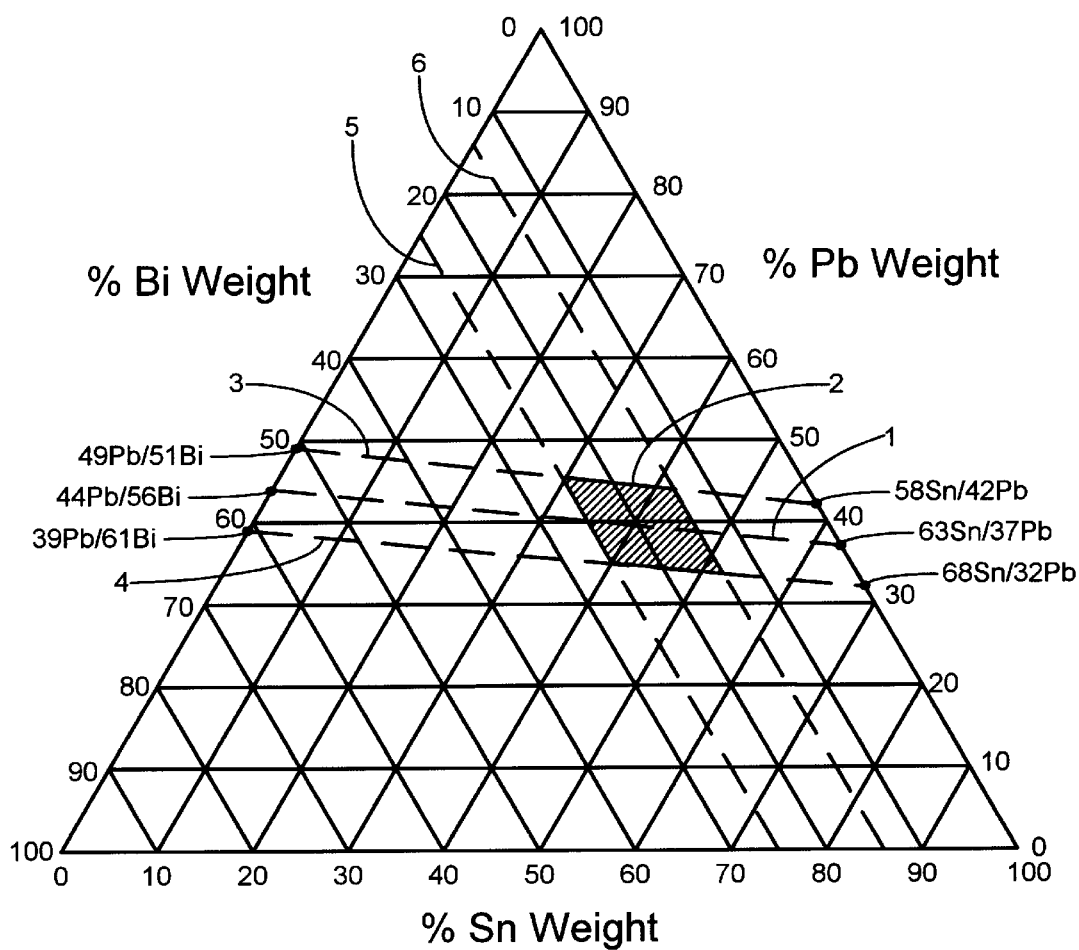
FIG. 1 is an composition diagram depicting the percentage (by weight) of tin, lead, and bismuth in the solder alloy created when a mixed solder paste according to the invention is reflowed.

As shown in the drawing for purposes of illustration, the invention provides a new mixed solder paste that is useful in the assembly of electronic components. The invention provide a low-cost mixed solder paste that reflows below about 158° C. to form a bismuth-lead-tin solder alloy with a melting point at least 10° C. higher than the peak reflow temperature of the mixed solder paste. The mixed solder paste according to the invention may be used to create strong tin-lead-bismuth solder joints at a lower temperature than would be required to reflow an unmixed solder paste including the tin-lead-bismuth solder alloy powder.

In addition, the reflow temperature of the mixed solder paste according to the invention is low enough that it can be used efficiently in step soldering processes in which the original soldered components are soldered using the common 63Sn—37Pb solder alloy. Step soldering processes are used when subsequent soldering operations occur after an initial solder process has already occurred. For example, it may be desirable to solder electronic components (subsequent components) to a PCB that already has some components soldered to it (original components). In order to protect the integrity of the solder connections connecting the original components to the PCB while step soldering, it is desirable that solder alloy holding the original components to the PCB not melt while soldering the subsequent components to the PCB.

Using the mixed solder paste according to the invention to solder subsequent components avoids melting the 63Sn—37Pb solder alloy solder holding the original components. This is because soldering processes using the mixed solder paste according to the invention can easily take place at about 178° C., about 20° C. above its reflow temperature. 178° C. is safely below the 183° C. melting point of the common 63Sn—37Pb solder alloy.

In addition, the mixed solder paste can be used effectively to solder additional subsequent components to a PCB that already has some original components soldered to it using the mixed solder paste. This is due to the at least 10° C. difference between the reflow temperature of the mixed solder paste and the melting temperature of the solder alloy formed by reflowing the solder paste. Using the mixed solder paste according to the invention to solder subsequent components avoids melting the solder alloy formed by a previous reflow of the mixed solder paste holding the original components. This is because soldering processes using the mixed solder paste according to the invention can take place at about 5° C. above its reflow temperature, at least 5° C. below the melting point of the solder alloy formed by the mixed solder paste.

FIG. 1 is an triangular alloy composition graph depicting the percentage, by weight, of the elements, tin (Sn), lead (Pb), and bismuth (Bi), of a given Bi—Pb—Sn solder alloy. Each side of the graph represents the percentage, by weight, of one of the elements. For each element, 100% of the element is represented by the corner of the triangle that represents 0% of the other two elements. Conversely, for each element, 0% is represented by one full side of the triangle that can indicate any possible mix of the other two elements totaling 100%. Thus, any particular point on the graph represents a solder alloy in which the percentage of Pb, the percentage of Sn, and the percentage of Bi in the solder alloy add up to 100%.

On the right side of the graph is a point labeled "63Sn/37Pb". This point represents a Sn—Pb solder alloy consisting of 63% Sn and 37% Pb, by weight. This particular Sn—Pb combination is known as eutectic Sn—Pb solder alloy since it has the lowest melting point, 183° C., of all alloys consisting of only Sn and Pb. Similarly, on the right side of the graph is a point labeled "44Pb/56Bi". This point represents a Pb—Bi solder alloy consisting of 44% Pb and 56% Bi, by weight. This is known as eutectic Pb—Bi solder alloy and has a melting point of 125° C.

Above and below the 63Sn/37Pb solder alloy in FIG. 1 are labeled two other solder alloys, 58Sn/42Pb and 68Sn/32Pb, respectively. For purposes of this description, these two solder alloys represent the endpoints of the range of what will be called "near eutectic" Sn—Pb solder alloy. For example, a solder alloy consisting of 60% Sn and 40% Pb (60Sn/40Pb) falls in this range. 60Sn/40Pb is commercially available and marketed as a near eutectic tin-lead solder alloy. Near eutectic Sn—Pb solder alloy includes the eutectic 63Sn/37Pb solder alloy.

Similarly, above and below the 44Pb/56Bi solder alloy in FIG. 1 are labeled two other solder alloys, 49Pb/51Bi and 39Pb/61Bi, respectively. For purposes of this description, these two solder alloys represent the endpoints of the range of what will be called "near eutectic" Pb—Bi solder alloy. Near eutectic Pb—Bi solder alloy includes the eutectic 44Pb/56Bi solder alloy.

The mixed solder paste according to the invention includes Sn—Pb solder powder and Pb—Bi solder powder suspending in a flux vehicle. The manufacture of solder pastes including mixed solder pastes (U.S. Pat. No. 5,382, 300) is known in the art and includes the manufacture of both solder powders from selected solder alloys and the manufacture of appropriate flux vehicles for use in solder pastes. Preferably the Sn—Pb solder powder includes eutectic or near eutectic Sn—Pb solder alloy, and the Pb—Bi solder powder includes eutectic or near eutectic Pb—Bi solder alloy.

When mixed with the flux carrier in the appropriate ratios, the Sn—Pb solder powder and the Pb—Bi solder powder will form a mixed solder paste with new and unique properties including an ability to reflow at a relatively low temperature below 158° C. to form a solder structure with a melting temperature at least 10° C. above the reflow temperature. For purposes of this description, reflow temperature means the temperature at which the solder paste passes through a plastic or "mushy" state and takes on the properties of a liquid including the ability to wet, flow, and coalesce. It must be noted that at the reflow temperature, some solid alloy particles may exist so long as they don't hinder the overall liquid characteristics of the reflowed solder.

During the early stages of a mixed solder paste heating cycle, solid-solid diffusion between the two paste powders progresses quickly. This diffusion induce a new bismuth-lead-tin (Bi—Pb—Sn) ternary eutectic structure in the solder paste (52Bi—30Pb—18Sn) that melts at approximately 96° C. (~96° C. structure). The ~96° C. structures melt before the temperature of the solder paste reaches the eutectic Pb—Bi melting temperature, 125° C. The molten ~96° C. structures initiate wetting of the solder pad and promote dissolution of the remaining solid solder powder particles in the solder paste.

As the heating cycle continues above 125° C., the remainder of the Pb—Bi solder particles become molten, continuing the process of wetting of the solder pad further promoting dissolution of the remaining solid solder particles. As the temperature continues to rise during the heating cycle, more of the solder particles become molten and coalesce with the other molten solder particles. At the reflow temperature, enough of the particles have become molten that the solder paste reflows and forms the desired solder structure. At this point, the composition of the molten solder alloy becomes fairly consistent throughout. The proportion of Sn, Pb, and Bi in the molten alloy is determined by the proportion of each element within in the original Sn—Pb and Pb—Bi solder powders and the ratio of the Sn—Pb solder powder to the Pb—Bi solder powder in the mixed solder paste.

If the appropriate Sn—Pb and Pb—Bi solder powders were selected and mixed in the proper ratio, the molten solder will take on the properties of a Bi—Pb—Sn solder alloy having a melting temperature at least 10° C. above the reflow temperature of the mixed solder paste and lacking any ~96° C. structures that can weaken Bi—Pb—Sn solder structures. Thus, if the soldering process is taking place at a temperature above the reflow temperature of the solder paste and below the melting temperature of Bi—Pb—Sn solder alloy, the reflowed solder will solidify even without cooling. As it solidifies (with or without cooling), any remaining unmelted solder particles act as nuclei for the solidification. Solder joints made with the mixed solder paste have a uniform micro-structure and have mechanical properties comparable with solder joints made by reflowing an unmixed Pb—Sn—Bi—Pb—Sn solder alloy paste (at a temperature above the melting temperature of the Bi—Pb—Sn solder alloy). Thus, the mixed solder paste according to the invention reduces the required soldering temperature and forms joints with good mechanical properties.

Referring now to FIG. 1, line 1 extends between the point representing the eutectic 63Sn/37Pb alloy and the point representing the eutectic 44Pb/56Bi solder alloy. Line 1 represents all possible Bi—Pb—Sn alloys that can be formed by mixing the 63Sn/37Pb alloy and the 44Pb/56Bi alloy.

Region 2 represents those Bi—Pb—Sn solder alloys that melt at least 10° C. above the reflow temperature of a mixed solder paste according to the invention that is used to form them, lack ~96° C. structures, and solidify after reflowing the mixed solder paste with a uniform micro-structure. Region 2 is bounded on one side by line 3 extending between the point representing an "upper" limit of the near eutectic Sn—Pb alloys, 58Sn 42Pb, and the point representing an "upper" limit of the near eutectic Pb—Bi alloys, 49Pb/51Bi. The region is bounded on a second side by line 4 extending between the point representing a "lower" limit of the near eutectic Sn—Pb alloys, 68Sn/32Pb, and the point representing a "lower" limit of the near eutectic Pb—Bi alloys, 39Pb/61Bi.

The region 2 is bounded on a third side by line 5 representing Bi—Pb—Sn alloys with 25% Bi content. This boundary is established since Bi—Pb—Sn alloys with a Bi content exceeding 25% have been found to contain ~96° C. structures that can weaken a solder joint. The region is bounded on the fourth and final side by line 6 representing Bi—Pb—Sn alloys with 14% Bi content. This boundary is established since Bi—Pb—Sn alloys with Bi content below 14% formed by reflowing a mixed solder paste according to the invention tend to have non-uniform micro-structures that can weaken a solder joint.

In the preferred embodiment of the invention, the mixed solder paste is a mixture of eutectic 63Sn/37Pb solder powder, eutectic 44Pb/56Bi solder powder, and a flux vehicle that reflows below 158° C. The ratio of the 63Sn/37Pb solder powder to the 44Pb/56Bi solder powder within the mixed solder paste is preferably between 55:45 to 65:35.

It is understood however, that near eutectic Sn—Pb solder powder, including the commercially available 60Sn/40Pb solder powder, and near eutectic Pb—Bi solder powder may be substituted for the eutectic Sn—Pb solder powder and the eutectic Pb—Bi solder powder, respectively. In cases where near eutectic solder powders are substituted for one or both of the eutectic solder powders, the ratio of the Sn—Pb solder powder to the Pb—Bi solder powder should be between about 51:49 and about 77:23. A mixed solder paste containing a near eutectic solder powder should form a solder alloy containing between about 33% and 46% lead, by mass.

Further, it is understood that the Sn—Pb solder powder might include a percentage of at least one additional component beyond Sn and Pb. The additional component might be an impurity in the alloy or it might be intentionally added to alter the characteristics of the alloy. Examples of an additional components would include indium (In) or silver (Ag). Similarly, it is understood that the Pb—Bi solder powder might include a percentage of at least one additional component beyond Pb and Bi.

Additionally, it is understood that while the preferred embodiment of the invention includes only the Sn—Pb and Pb—Bi alloys in the mixed solder paste according to the invention, some embodiments might include one or more additional powders beyond the Sn—Pb solder powder and Pb—Bi solder powder. Such powders might include pure metallic powders such as Sn, Pb, or Bi or alloy powders such as a Bi—Pb—Sn solder alloy.

One example of the mixed solder paste according to the invention has the 63Sn/37Pb solder powder and the 44Pb/

56Bi solder powder mixed in a ratio of 59:41 (Paste A). Paste A has been shown to reflow at 144° C. and formed a 40Pb—37Sn—23Bi solder alloy (Alloy A) with a melting point of 157° C. Alloy A has a uniform micro-structure and lacks ~96° C. structures.

A second example of the mixed solder paste according to the invention has the 63Sn/37Pb solder powder and the 44Pb/56Bi solder powder mixed in a ratio of 65:35 (Paste B). Paste B has been shown to reflow at 156° C. and formed a 39Pb—41Sn—20Bi solder alloy (Alloy B) with a melting point of 167° C. Alloy B also has a uniform micro-structure and lacks ~96° C. structures.

The invention additionally provides a method for forming the mixed solder paste according to the invention. First, a flux vehicle is provided. Flux vehicles appropriate for solder paste formulation are known in the art.

Next, a first solder powder including a first alloy that includes tin and lead is provided. The first solder alloy is preferably an eutectic 63Sn/37Pb solder alloy or a near eutectic Sn—Pb solder alloy in the range of 68Sn/32Pb to 58Sn/42Pb. Methods of forming solder powders from solder alloys are known in the art. Preferably the solder powder has a fine granularity which will result in quicker reflow and a more uniform micro-structure in the solder alloy formed by the reflow. As discussed above, it is understood that the Sn—Pb solder powder might include a percentage of at least one additional component beyond Sn and Pb.

A second solder powder including a second alloy including lead and bismuth in then provided. The second solder alloy is preferably an eutectic 44Pb/56Bi solder alloy or a near eutectic Pb—Bi solder alloy in the range of 39Pb/61Bi to 49Pb/51Bi. As discussed above, it is understood that the Pb—Bi solder powder might include a percentage of at least one additional component beyond Pb and Bi.

The steps of providing a flux powder, providing a first solder powder, and providing a second solder powder may be carried out in any order and may also be combined. For example, a first solder paste including the first solder powder and a first portion of the flux vehicle can be provided. Similarly, a second solder paste including the second solder paste and a second portion of the flux vehicle may provided.

Once the flux vehicle, the first solder powder, and the second powder have been provided, they are mixed together to form a mixed solder paste. The mixed solder paste has a reflow temperature below 158° C. and at least 10° C. below a melting temperature of a solder alloy formed when the mixed solder paste is reflowed.

The step of mixing the first solder powder, second solder powder, and flux vehicle may be accomplished by mixing the three components in any order. For example, the first solder powder and second solder powder may first be mixed together and then combined with the flux vehicle. Alternatively, the first solder powder and a portion of the flux vehicle may first be together to form a first solder paste. The second solder powder could then be combined with the first solder paste to form the mixed solder paste according to the invention. In another alternative embodiment, the second solder powder could be mixed independently with a second portion of the flux vehicle to form a second solder paste. The second solder paste could then be combined with either the first solder powder or the first solder paste to form the mixed solder paste according to the invention.

Further, the step of mixing the flux vehicle, first solder powder and second solder powder should include mixing the first solder powder and the second solder powder in a ratio, by mass, of between about 49:51 and about 77:23, but preferably between about 55:45 and about 65:35. As discussed above, it is understood that one or more additional powders beyond the Sn—Pb solder powder and Pb—Bi solder powder may be included in the mixed solder paste according to the invention. Such powders might include pure metallic powders such as Sn, Pb, or Bi or alloy powders such as a Bi—Pb—Sn solder alloy.

Alternatively, the first solder powder and the second solder powder should be mixed in a ratio in which bismuth accounts for between about 14% and about 25% of a metallic mass of the mixed solder paste and lead accounts for between about 33% and about 46% of the metallic mass of the mixed solder paste.

In addition, the melting point of the solder alloy according to the invention is low enough that it can be used efficiently in step soldering processes in which the original soldered components are soldered using the common 63Sn—37Pb solder alloy. Step soldering processes are used when subsequent soldering operations occur after an initial solder process has already occurred. For example, it may be desirable to solder electronic components (subsequent components) to a PCB that already has some components soldered to it (original components). In order to protect the integrity of the solder connections connecting the original components to the PCB while step soldering, it is desirable that solder alloy holding the original components to the PCB not melt while soldering the subsequent components to the PCB.

Using the solder alloy according to the invention to solder subsequent components avoids melting the 63Sn—37Pb solder alloy solder holding the original components. This is because soldering processes using the solder alloy according to the invention can easily take place at about 178° C., about 20° C. above its melting temperature. 178° C. is safely below the 183° C. melting point of the common 63Sn—37Pb solder alloy.

Bismuth-lead-tin ternary eutectic structures (52Bi—30Pb—18Sn) that melt at approximately 96° C. (~96° C. structures) are present in many of the bismuth-lead-tin solder alloys that melt below about 158° C. These ~96° C. structures may cause portions of a lead-tin-bismuth solder alloy to melt before the overall solder alloy melts resulting in a "plastic" phase that is neither completely solid nor completely melted. In addition, the ~96° C. structures in bismuth-lead-tin solder alloys have been found to create solder joints that can be unreliable due when subjected to thermal cycling above 96° C. resulting in premature fatigue failure. The solder alloy formed by reflowing the mixed solder paste according to the invention does not have these ~96° C. structures even when used with Sn—Pb clad electronic component leads or PCBs.

Having thus described exemplary embodiments of the invention, it will be apparent that further alterations, modifications, and improvements will also occur to those skilled in the art. Such alterations, modifications, and improvements, though not expressly described or mentioned above, are nonetheless intended and implied to be within the scope of the invention. Accordingly, the foregoing discussion is intended to be illustrative only; the invention is limited and defined only by the various following claims and equivalents thereto.

We claim:

1. A mixed solder paste for low temperature soldering, comprising:

a near eutectic tin-lead solder powder having a first mass;

a near eutectic lead-bismuth solder powder having a second mass; and a flux vehicle, in which a reflow temperature of the mixed solder paste is:

below 158° C.; and at least 10° C. below a melting temperature of a solder alloy formed when the mixed solder paste is reflowed.

2. The mixed solder paste of claim 1, in which the first mass and the second mass have a ratio of between about 51:49 and about 77:23.

3. The mixed solder paste of claim 1, in which the first mass and the second mass have a ratio is between about 55:45 and about 65:35.

4. The mixed solder paste of claim 1, in which:

the second mass includes a bismuth mass; and the bismuth mass is between about 14% and about 25% of a sum of the first mass and the second mass.

5. The mixed solder paste of claim 4, in which:

the first mass includes a first lead mass;

the second mass includes a second lead mass; and a sum of the first lead mass and the second lead mass is between about 33% and about 46% of the sum of the first mass and the second mass.

6. The mixed solder paste of claim 1, in which the solder alloy has a uniform micro-structure.

7. A mixed solder paste, comprising:

a first solder powder including a first alloy including tin and lead;

a second solder powder including a second alloy including lead and bismuth; and a flux vehicle, the mixed solder paste reflowing at a reflow temperature below 158° C. to form a solder alloy with a melting temperature at least 10° C. above the reflow temperature.

8. The mixed solder paste of claim 7, in which:

the tin and the lead in the first alloy are in a ratio of between about 58:42 and about 68:32, by mass; and the lead and the bismuth in the second alloy are in a ratio of between about 39:61 and about 49:51, by mass.

9. The mixed solder paste of claim 8, in which the solder alloy includes between about 14% and about 25% bismuth, by mass.

10. The mixed solder paste of claim 9, in which the solder alloy has a uniform micro-structure and lacks ternary eutectic structures occurring at approximately 96° C.

11. The mixed solder paste of claim 9, in which:

the tin and the lead in the first alloy are in a ratio of between about 60:40 and about 63:37, by mass; and the lead and the bismuth in the second alloy are in a ratio of about 44:56, by mass.

12. A method for forming a mixed solder paste for low temperature soldering, comprising:

(a) providing a flux vehicle;

(b) providing first solder powder including a first alloy including tin and lead;

(c) providing second solder powder including a second alloy including lead and bismuth; and (d) mixing the flux vehicle, the first solder powder, and the second powder together to form the mixed solder paste having a reflow temperature below 158° C. and at least 10° C. below a melting temperature of a solder alloy, formed when the mixed solder paste is reflowed.

13. The method of claim 12, in which step (d) additionally comprises:

mixing the flux vehicle and the first solder powder to form a first solder paste;

mixing the flux vehicle and the second solder powder to form a second solder paste; and mixing the first solder paste and the second solder paste together to form the mixed solder paste.

14. The method of claim 12, in which in step (d) the first solder powder and the second solder powder are mixed in a ratio, by mass, of between about 49:51 and about 77:23.

15. The method of claim 12, in which in step (d) the first solder powder and the second solder powder are mixed in a ratio, by mass, of between about 55:45 and about 65:35.

16. The method of claim 15, in which:

the first alloy has a ratio of tin to lead, by mass, of between about 58:42 and about 68:32; and the second alloy has a ratio of lead to bismuth, by mass, of between about 39:61 and about 49:51.

17. The method of claim 15, in which:

the first alloy has a ratio of tin to lead, by mass, of between about 60:40 and about 63:37; and the second alloy has a ratio of lead to bismuth, by mass, of about 44:56.

18. The method of claim 12, in which in step (d) the first solder powder and the second solder powder are mixed in a ratio in which bismuth accounts for between about 14% and about 25% of a metallic mass of the mixed solder paste.

19. The method of claim 18, in which in step (d) the first solder powder and the second solder powder are mixed in a ratio in which lead accounts for between about 33% and about 46% of the metallic mass of the mixed solder paste.

* * * * *

UNITED STATES PATENT AND TRADEMARK OFFICE
CERTIFICATE OF CORRECTION

PATENT NO. : 6,214,131 B1
DATED : April 10, 2001
INVENTOR(S) : Fay Hua, Zegun Mei and Judith Glazer It is certified that error appears in the above-identified patent and that said Letters Patent is hereby corrected as shown below:

Title page,
The inventor should read -- Fay Hua, Mountain View; Zegun Mei, Cupertino; Judith Glazer, Los Altos, all of California --

Signed and Sealed this

Eighteenth Day of December, 2001

*Attest:*

*Attesting Officer*

JAMES E. ROGAN
*Director of the United States Patent and Trademark Office*